(12) United States Patent
Nakayama et al.

(10) Patent No.: US 11,541,554 B2
(45) Date of Patent: Jan. 3, 2023

(54) NON-CONTACT TRANSPORT DEVICE

(71) Applicant: SMC CORPORATION, Tokyo (JP)

(72) Inventors: Toru Nakayama, Soka (JP); Toru Sugiyama, Abiko (JP); Masaru Saitoh, Joso (JP); Hiroaki Saka, Bando (JP)

(73) Assignee: SMC CORPORATION, Tokyo (JP)

(*) Notice: Subject to any disclaimer, the term of this patent is extended or adjusted under 35 U.S.C. 154(b) by 0 days.

(21) Appl. No.: 17/169,601

(22) Filed: Feb. 8, 2021

(65) Prior Publication Data
US 2021/0252720 A1 Aug. 19, 2021

(30) Foreign Application Priority Data
Feb. 19, 2020 (JP) .............. JP2020-026447

(51) Int. Cl.
B25J 15/06 (2006.01)
H01L 21/683 (2006.01)

(52) U.S. Cl.
CPC ....... B25J 15/0683 (2013.01); H01L 21/6838 (2013.01)

(58) Field of Classification Search
CPC B25J 15/0616; B25J 15/0683; H01L 21/6838
USPC ....................................... 294/64.3
See application file for complete search history.

(56) References Cited

U.S. PATENT DOCUMENTS

| 3,438,668 A | * | 4/1969 | Williams | ............ B66C 1/0293 |
| | | | | 271/97 |
| 4,118,058 A | * | 10/1978 | Rahn | .................. B65G 47/911 |
| | | | | 294/64.3 |
| 5,513,668 A | * | 5/1996 | Sumnitsch | ......... H01L 21/6838 |
| | | | | 134/153 |

(Continued)

FOREIGN PATENT DOCUMENTS

| EP | 2 287 095 A2 | 2/2011 |
| JP | S63-051446 | 4/1988 |

(Continued)

OTHER PUBLICATIONS

Extended European Search Report dated Jun. 17, 2021 in European Patent Application No. 21155673.3, 9 pages.

(Continued)

Primary Examiner — Dean J Kramer
(74) Attorney, Agent, or Firm — Oblon, McClelland, Maier & Neustadt, L.L.P.

(57) ABSTRACT

A non-contact transport device includes a deflector having a flange portion provided with a plurality of nozzle grooves extending radially outward and arranged equidistantly in the circumferential direction. The nozzle grooves are each formed to be hollowed with respect to an upper surface of the flange portion so as to have an arc-shaped cross section, and constitute lead-out channels together with a flat surface of a hollow of a body. A pressure fluid is supplied through a first port of the body into the body and flows through the plurality of nozzle grooves to a workpiece holding surface (Continued)

along first and second curved surfaces of the hollow. As a result, the pressure fluid flowing at high speed between the workpiece holding surface and a workpiece generates a suction force exerted toward the body side, whereby the workpiece is suctioned.

11 Claims, 15 Drawing Sheets

(56) References Cited

U.S. PATENT DOCUMENTS

| | | | | |
|---|---|---|---|---|
| 7,452,016 | B2* | 11/2008 | Tanae | B65G 49/061 |
| | | | | 294/64.3 |
| 7,510,226 | B2* | 3/2009 | Akiyama | H01L 21/6838 |
| | | | | 414/941 |
| 7,597,370 | B2* | 10/2009 | Tanae | B65G 47/91 |
| | | | | 294/64.3 |
| 8,714,609 | B2* | 5/2014 | Sydorko | H01L 21/6838 |
| | | | | 294/64.3 |
| 9,381,652 | B2* | 7/2016 | Abe | B25J 15/0616 |
| 2011/0061999 | A1* | 3/2011 | Cho | B25J 15/0616 |
| | | | | 198/689.1 |
| 2011/0278870 | A1 | 11/2011 | Omiya et al. | |
| 2016/0300749 | A1* | 10/2016 | Iwasaka | B65G 47/911 |
| 2019/0027393 | A1 | 1/2019 | Iwasaka et al. | |

FOREIGN PATENT DOCUMENTS

| | | |
|---|---|---|
| JP | H05-136254 | 6/1993 |
| JP | 2002-319611 A | 10/2002 |
| JP | 2004-119784 A | 4/2004 |
| JP | 2006-346783 A | 12/2006 |
| JP | 5110480 B2 | 12/2012 |
| JP | 2014-227260 A | 12/2014 |
| WO | WO 2013/018527 A1 | 2/2013 |

OTHER PUBLICATIONS

Office Action dated Sep. 23, 2022 in Japanese Patent Application No. 2020-026447 w/English-language Translation.

* cited by examiner

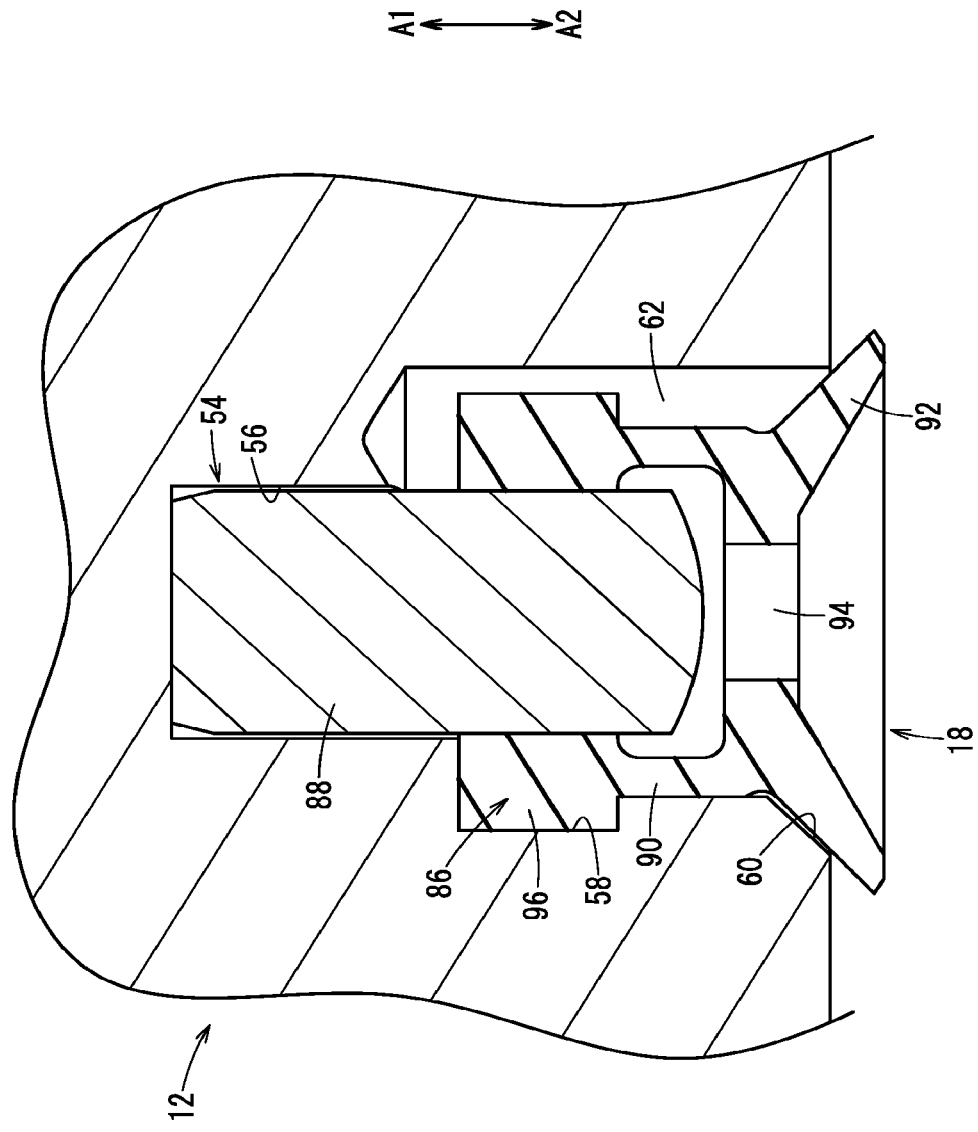

ND-CONTACT TRANSPORT DEVICE

CROSS-REFERENCE TO RELATED APPLICATION

This application is based upon and claims the benefit of priority from Japanese Patent Application No. 2020-026447 filed on Feb. 19, 2020, the contents of which are incorporated herein by reference.

BACKGROUND OF THE INVENTION

Field of the Invention

The present invention relates to a non-contact transport device capable of holding and transporting a workpiece in a non-contact state by supplying a pressure fluid.

Description of the Related Art

The applicant hereof proposes, in Japanese Patent No. 5110480, a non-contact transport device capable of transporting a workpiece in a non-contact manner by utilizing the Bernoulli effect generated by a gas flow. The non-contact transport device includes a housing, a disc-shaped plate mounted in the center of the housing, and a seal ring fitted between the housing and the plate.

Then, in the non-contact transport device, the pressure fluid supplied to the supply port of the housing flows into a space between a projection of the plate and a hollow of the housing, is conducted radially outward through first and second nozzle grooves forming nozzles, and is then guided radially outward along the inner peripheral surface of the hollow of the housing toward the lower surface of the housing, so that the fluid flows along the lower surface at high speed.

Under this condition, as the housing is brought closer to a workpiece, the pressure fluid flows at high speed on the lower surface side of the housing, and a negative pressure is generated by virtue of the Bernoulli effect, so that the workpiece is suctioned and held in a non-contact state with the workpiece being out of contact with the housing.

SUMMARY OF THE INVENTION

It is generally an object of the present invention to provide a non-contact transport device capable of holding and transporting a workpiece in a more reliable and stable manner.

The aspect of the present invention resides in a non-contact transport device that suctions a workpiece by supplying a pressure fluid and holds and transports the workpiece in a non-contact state, the non-contact transport device comprising: a body including, in an axial end thereof, a workpiece holding surface opposing the workpiece; a passage formed inside the body and configured to allow the pressure fluid supplied from an air supply unit to flow therethrough; a plurality of nozzles formed inside the body along a circumferential direction of the body, extending outward in a radial direction in communication with a downstream end of the passage, and configured to conduct the pressure fluid inside the passage toward the workpiece holding surface; and a hollow axially depressed with respect to the workpiece holding surface and configured to connect radial ends of the nozzles and the workpiece holding surface, wherein the nozzles extend outward in the radial direction with at least a part of each of the nozzles hollowed toward a side of the workpiece holding surface in an axial direction of the body so as to have an arc-shaped cross section.

According to the present invention, the body constituting the non-contact transport device includes a workpiece holding surface formed on the axial end side thereof and opposing a workpiece, a passage formed therein and allowing a pressure fluid to flow therethrough, a plurality of nozzles communicating with the downstream end of the passage and extending radially outward to conduct the pressure fluid to the workpiece holding surface side, and a hollow depressed in the axial direction with respect to the workpiece holding surface to connect the radial ends of the nozzles and the workpiece holding surface. In this configuration, the nozzles extend radially outward with at least a part of each nozzle hollowed toward the workpiece holding surface side in the axial direction of the body so as to have an arc-shaped cross section.

Accordingly, by providing a plurality of nozzles having an arc-shaped cross section at least in part to radially conduct, toward the hollow, the pressure fluid introduced from the air supply unit into the passage, the pressure fluid flows along the surface of the hollow to the workpiece holding surface by virtue of the Coanda effect. As a result, when compared with a configuration where, for example, nozzles are formed to have a circular cross section or rectangular cross section, the configuration of the present invention can suppress generation of eddy current when the pressure fluid flows, hence favorably reduce pressure loss.

As a result, by causing the pressure fluid to flow along the hollow surface from the nozzles to the workpiece holding surface in a stable manner at a desired flow rate, it is possible to obtain a greater suction force in the vicinity of the workpiece holding surface, whereby the workpiece can be held and transported reliably and stably while the workpiece is kept out of contact with the workpiece holding surface.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 9 is a sectional view taken along a line IX-IX of FIG. 7;

DESCRIPTION OF THE PREFERRED EMBODIMENTS

Figure 1:
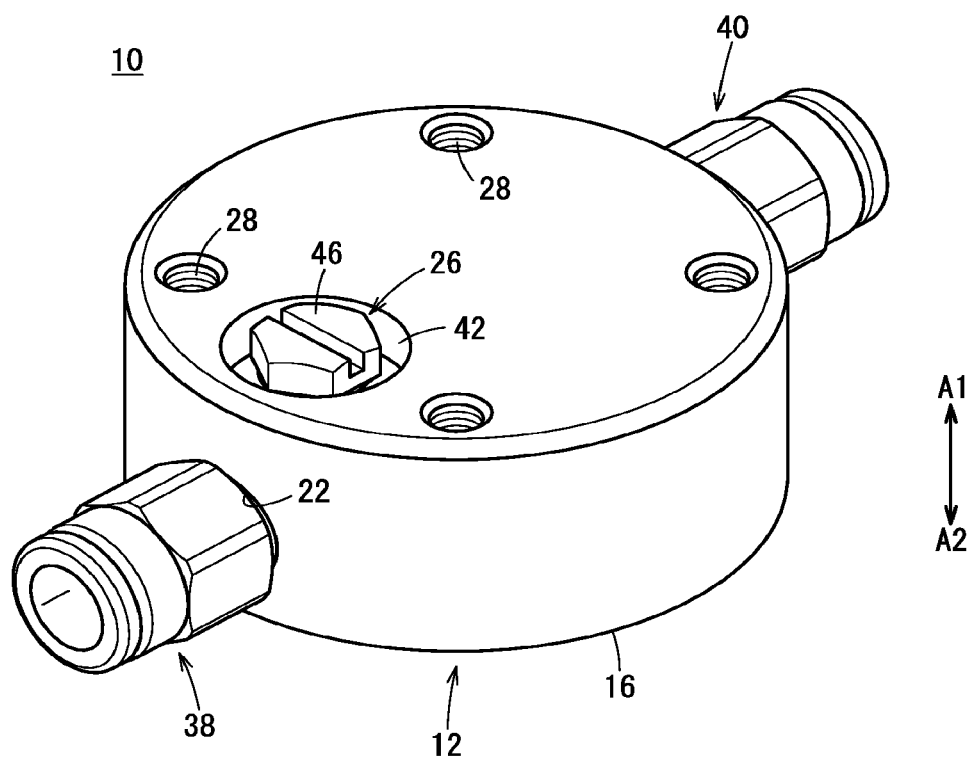
FIG. 1 is an external perspective view of a non-contact transport device according to the first embodiment of the present invention.
Figure 2:
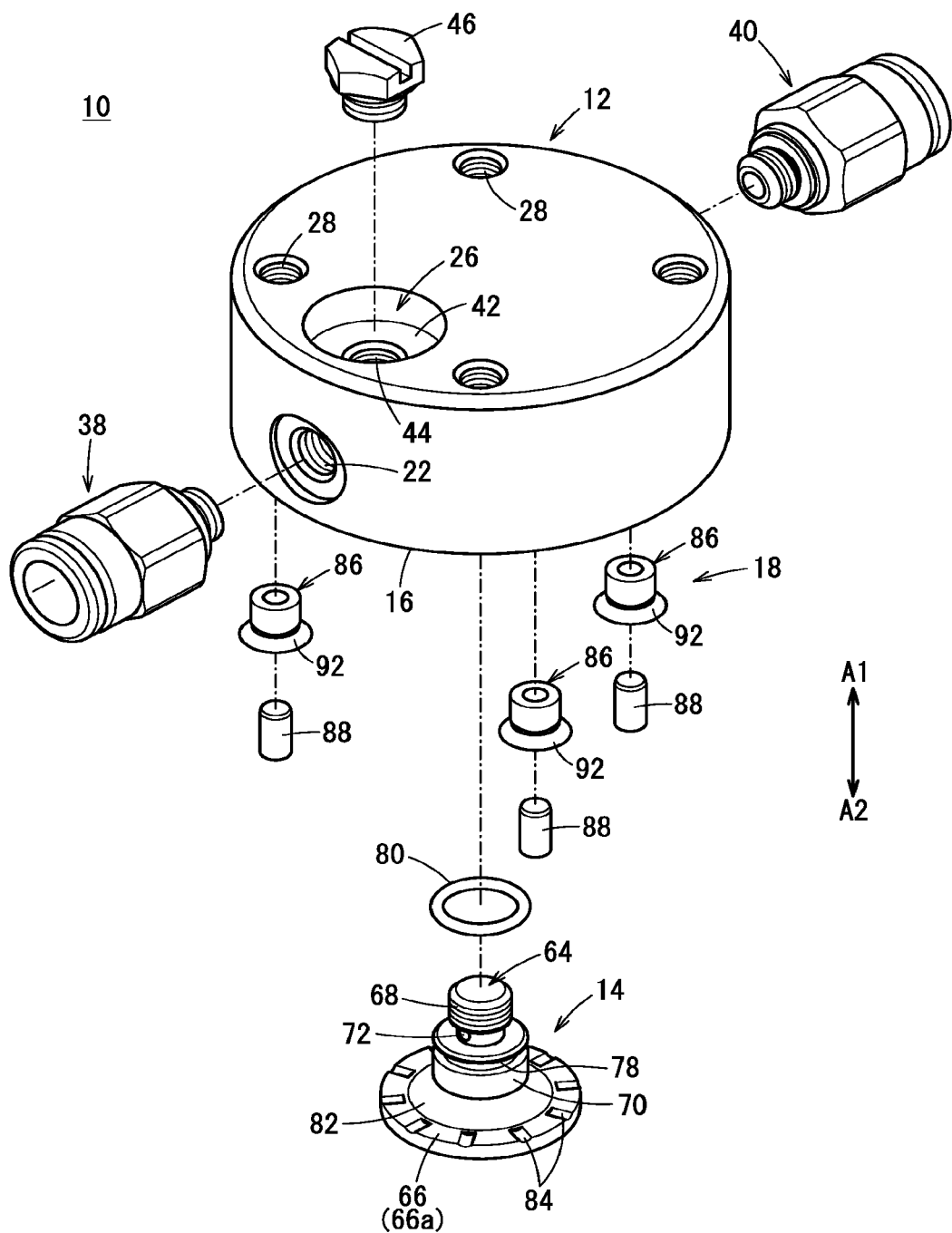
FIG. 2 is an exploded perspective view of the non-contact transport device shown in FIG. 1.
Figure 3:
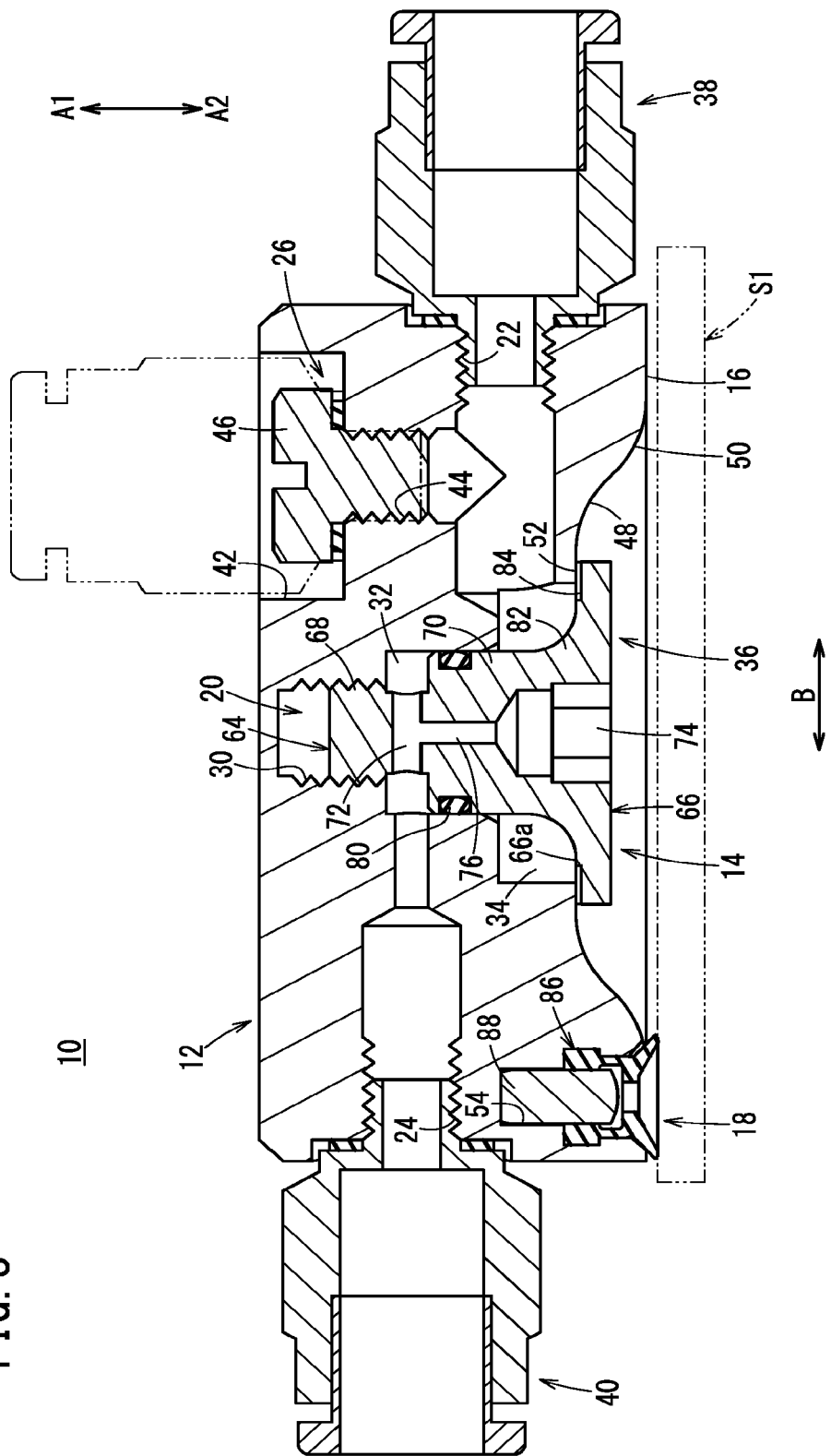
FIG. 3 is an overall sectional view of the non-contact transport device shown in FIG. 1.
Figure 4:
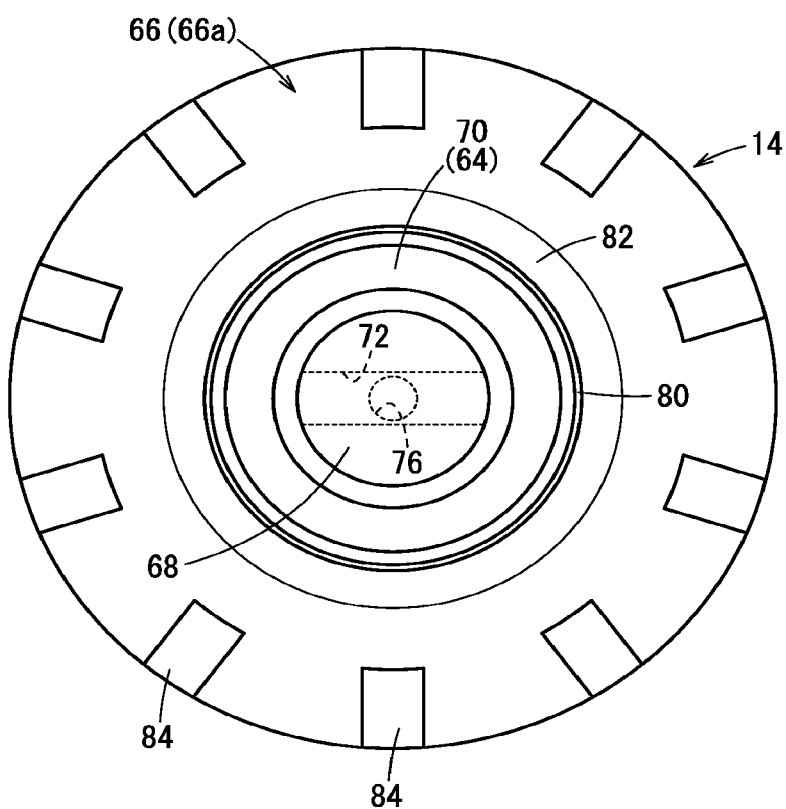
FIG. 4 is a plan view of a deflector shown in FIG. 2 as viewed from above in the axial direction.

As shown in FIGS. 1 to 3, a non-contact transport device 10 according to the first embodiment includes a body 12 formed so as to have a circular cross section when viewed from the axial direction, a deflector 14 housed inside the body 12, and stopper tools 18 provided in the body 12 on a workpiece holding surface 16 for holding a workpiece S1 (see FIG. 3).

The body 12 is formed, for example, of a metal material in a cylindrical shape, and has a bore 20 opened at the lower end in the center thereof, first and second ports 22 and 24 formed on the outer periphery thereof and extending radially inward, and a sub port 26 opened at the upper end. On the upper end of the body 12, four mounting holes 28 for fixing the non-contact transport device 10 to the arm end of an unillustrated robot or the like are formed.

The bore 20 extends in the axial direction of the body (direction of arrows A1 and A2) so as to be able to receive, from below, the deflector 14 described later. The bore 20 includes a threaded hole 30 formed at the upper end of the bore 20 and provided with a thread on the inner peripheral surface thereof, an intermediate hole 32 formed below the threaded hole 30 (in the direction of arrow A2) and expanded in diameter, and a lead-out hole (passage) 34 formed below the intermediate hole 32 and having a more expanded diameter. This lead-out hole 34 communicates with a hollow 36 formed in the workpiece holding surface 16. That is, the bore 20 is formed in a straight line in the axial direction (direction of arrows A1 and A2) at the axial center of the body 12, the threaded hole 30 has the smallest diameter, and the lead-out hole 34 has the largest diameter.

The first port (air supply unit) 22 and the second port 24 are each opened in the outer peripheral surface of the body 12 and extend radially inward, and the first and second ports 22 and 24 are positioned on a straight line that passes through the axial center of the body 12, as viewed from the axial direction of the body 12.

The first port 22 is screw-connected with a first coupling plug 38 that is connected to an unillustrated pipe reaching an unillustrated pressure fluid supply source, while the inner end of the first port 22 is joined to and communicates with the periphery of the lead-out hole 34. Meanwhile, the second port 24 is screw-connected with a second coupling plug 40 that is connected to an unillustrated pipe reaching a pressure detecting device (not shown) such as a pressure sensor, for example, while the inner end of the second port 24 is joined to and communicates with the periphery of the intermediate hole 32. That is, the first and second ports 22 and 24 are formed so as to be offset with respect to the axial direction (direction of arrows A1 and A2) of the body 12.

The sub port 26 is formed in the upper end of the body 12 at a position radially outward from the axial center of the body 12, and has a depressed portion 42 depressed in the axial direction (arrow A2 direction) and having a circular cross section, and a bolt hole 44 penetrating through the center of the depressed portion 42 and connected to and communicating with the middle of the first port 22. The first coupling plug 38 capable of supplying a pressure fluid can be selectively connected to the sub port 26.

For example, when the pressure fluid is supplied from the upper end side of the non-contact transport device 10 through the sub port 26, a sealing bolt 46 is removed from the sub port 26, then the first coupling plug 38 is joined to the sub port 26, as shown by the two-dot chain line in FIG. 3, and the sealing bolt 46 is screwed into the first port 22 to shut it off. As a result, the pressure fluid supplied from the first coupling plug 38 is fed from the bolt hole 44 of the sub port 26 to the middle of the first port 22.

On the other hand, when the pressure fluid is supplied from the outer peripheral side of the non-contact transport device 10 where the first port 22 is opened, the first coupling plug 38 is joined to the first port 22 and the sub port 26 is shut off by the sealing bolt 46.

As shown in FIG. 3, on the lower end of the body 12, the workpiece holding surface 16 capable of holding the workpiece S1 in a non-contact manner is formed so as to be flat and perpendicular (the direction of arrow B) to the axial direction of the body 12, while the hollow 36 having a circular shape when viewed from the axial direction is formed in the substantial center of the workpiece holding surface 16. The hollow 36 is formed by being depressed to one side in the axial direction (indicated by arrow A1) with respect to the workpiece holding surface 16, so as to be connected to the axial lower end of the lead-out hole 34 in the bore 20. This hollow 36 is formed so as to have the same cross sectional shape along the circumferential direction of the body 12.

The hollow 36 extends radially outward from the axial lower end of the lead-out hole 34, and is formed of a first curved surface (curved surface) 48 that extends downward and radially outward while being gently curved, a second curved surface (curved surface) 50 that extends downward and radially outward from the radial outside edge of the first curved surface 48 while being gently curved, and a flat surface 52 formed on the radially inner side of the first curved surface 48.

Figure 5:
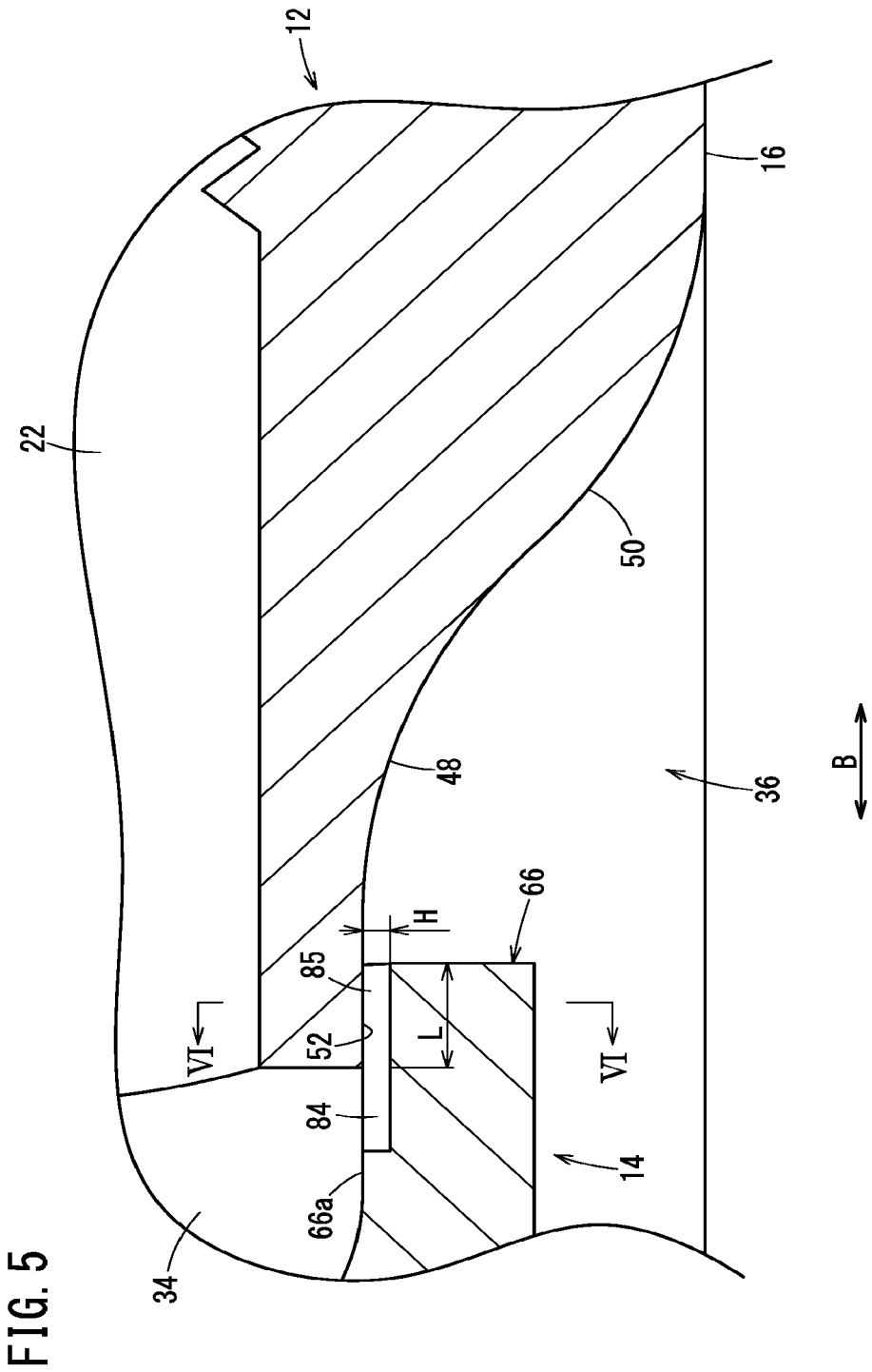
FIG. 5 is an enlarged sectional view showing the vicinity of a nozzle groove in the non-contact transport device of FIG. 3.

As shown in FIGS. 3 and 5, the first curved surface 48 has an arc-shaped cross section that is curved upward (in the direction of arrow A1) while the second curved surface 50 has an arc-shaped cross section that is curved downward (in the direction of arrow A2).

Further, the second curved surface 50 is curved so that the outer edge portion on the radially outer side gradually approaches and connects to the workpiece holding surface 16. In other words, the hollow 36 is formed so that the direction of curvature changes at a position where the first curved surface 48 and the second curved surface 50 join each other.

Figure 6:
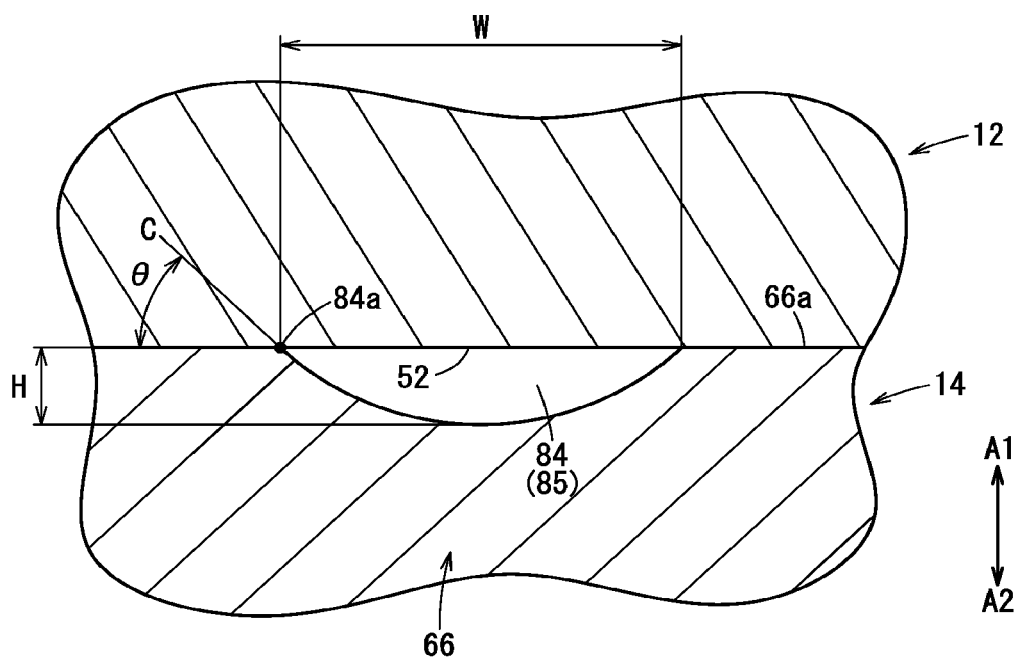
FIG. 6 is a sectional view along a line VI-VI of FIG. 5.

As shown in FIGS. 3, 5 and 6, the flat surface 52 is located on the radially innermost side of the hollow 36, extends radially inward by a predetermined width toward the portion facing the lead-out hole 34, and is formed in an annular shape so as to oppose the outer edge portion of the deflector 14 which will be described later. The flat surface 52 is connected at its radially outer edge to the first curved surface 48. It should be noted that instead of connecting the flat surface 52 and the workpiece holding surface 16 with the curved surface, the hollow may be formed by a sloping surface that is gently inclined from the flat surface 52 toward the workpiece holding surface 16.

Further, as shown in FIGS. 3 and 7 to 9, a plurality of mounting holes 54 into which stopper tools 18 are mounted are formed on the workpiece holding surface 16 at positions on the radial outside of the hollow 36. The mounting holes 54 are formed, for example, equidistantly in the circumferential direction on a circle centered at the axial center of the body 12. Each mounting hole 54 includes a pin hole portion 56 formed at the top thereof (on the arrow A1 side), a large-diametric portion 58 formed on the workpiece holding surface 16 side (on the arrow A2 side) of the pin hole portion 56 so as to be greater in diameter than the pin hole portion 56, and a pad hole portion 60 formed on the workpiece holding surface 16 side (on the arrow A2 side) of the large-diametric portion 58. In the mounting hole 54, the pin hole portion 56, the large-diametric portion 58, and the pad hole portion 60 are coaxially formed in the axial direction (the direction of arrows A1 and A2).

Further, as shown in FIG. 9, for the mounting hole 54, an air vent hole 62 is formed outside the pad hole portion 60 having the largest diameter. The air vent hole 62 extends along the axial direction (the direction of arrows A1 and A2) from the workpiece holding surface 16 through the pad hole portion 60 and the large diametric portion 58 to the middle of the pin hole portion 56.

As shown in FIGS. 2 to 5, the deflector 14 is formed of for example, metal and includes a rod portion 64 extending in the axial direction (direction of arrows A1 and A2), and a flange portion 66 expanded radially outward from the lower end of the rod portion 64.

The rod portion 64 includes a screw section 68 formed at the upper end of the rod portion 64 and provided with a thread on the outer peripheral surface thereof, and a rod body 70 formed under the screw section 68 (on the arrow A2 side) and expanded in diameter. The rod body 70 has substantially the same diameter as the intermediate hole 32 of the body 12, and has formed therein a communication hole 72 that radially penetrates through the rod body, and a detection passage 76 that extends in the axial direction from the communication hole 72 to a detection port 74 of the flange portion 66. Further, a seal ring 80 is fitted in an annular groove 78 on the outer peripheral surface of the rod body 70.

The flange portion 66 is integrally connected to the axial lower end of the rod body 70 in the rod portion 64 via a joint portion 82 having an arc-shaped cross section that gently expands in diameter. The flange portion 66 has an upper surface 66a and a lower surface formed to be flat and extending in the horizontal direction (direction of arrow B) substantially orthogonal to the axial direction (direction of arrows A1 and A2). Further, the upper surface 66a of the flange portion 66 has a plurality of nozzle grooves 84 formed near the outer peripheral part thereof equidistantly in the circumferential direction.

As shown in FIGS. 2 to 6, for example, ten nozzle grooves 84 are formed equidistantly in the circumferential direction around the rod portion 64, are hollowed downward (in the direction of arrow A2) with respect to the upper surface 66a of the flange portion 66 so as to have an arc-shaped cross section, and extend radially outward with respect to the center of the rod portion 64 of the deflector 14. The nozzle groove 84 is formed, for example, with a single radius.

Further, the nozzle groove 84 opposes the flat surface 52 of the body 12 when viewed from the extending direction of the nozzle groove 84 shown in FIG. 6, and is formed so as to satisfy a relationship of $\frac{1}{30}$ W<H≤W, where W is the width in the circumferential direction at an opening edge 84a where the width of the nozzle groove 84 is largest, and H is the axial depth in the axial direction (the direction of arrow A2). That is, the nozzle groove 84 is formed so that its axial depth H does not become greater than the width W at the opening edge 84a.

Further, as shown in FIG. 6, the nozzle groove 84 is formed so that the angle θ made between the tangent line C passing through the opening edge 84a and the upper surface 66a of the flange portion 66 is equal to or less than 90° (θ≤90°).

Further, the nozzle groove 84 is not limited to the configuration in which the cross section of the nozzle groove 84 viewed from its extending direction shown in FIG. 6 is an arc shape, but for example, the nozzle groove 84 may be formed of a pair of tapered surfaces inclined and extending straight from the upper surface 66a of the flange portion 66 toward the bottom portion (in the direction of arrow A2) and a curved surface that has an arc-shaped cross section so as to join one tapered surface with another. That is, the nozzle groove 84 can achieve the desired function as long as at least a part of the nozzle groove 84 has an arc-shaped cross section.

Further, as shown in FIGS. 3 and 5, the radially outer part of the nozzle groove 84 opposes the flat surface 52 of the hollow 36 in the body 12 so as to form, between the nozzle groove 84 and the flat surface 52, a lead-out channel (nozzle) 85 for leading the pressure fluid. The lead-out channel 85 is configured as shown in FIG. 5 so that the radial length L along the radial direction is larger than the axial depth H of the nozzle groove 84 (L>H).

The number of nozzle grooves 84 is appropriately set according to conditions such as the diameter of the body 12, the flow rate of the flowing pressure fluid, and the necessary strength of the suction force to be acted on the workpiece.

Then, as shown in FIG. 3, the deflector 14 is inserted into the bore 20 of the body 12 so that the rod body 70 is housed in the intermediate hole 32, and the screw portion 68 of the rod portion 64 is screwed into the threaded hole 30, whereby the rod portion 64 is coaxially coupled to the bore 20, thus the deflector 14 is fixed to the bore 20 of the body 12.

In addition, the communication hole 72 of the rod body 70 is arranged in a line with the second port 24 with respect to the radial direction to establish communication therebetween, and the outer peripheral part (nozzle grooves 84) of the flange portion 66 comes into contact with the flat surface 52 of the hollow 36, thereby forming the lead-out channels 85 while the bore 20 is enclosed with the flange portion 66. Further, the first port 22 communicates with the hollow 36 through the lead-out hole 34 and the nozzle grooves 84 (lead-out channels 85). It should be noted that the communication hole 72 is not limited to the case where the communication hole 72 is arranged in a straight line with the second port 24.

As shown in FIGS. 2, 3 and 7 to 9, the stopper tool 18 includes a pad member 86 fitted to the mounting hole 54 in the body 12, and a pin member 88 inserted into the mounting hole 54 through the pad member 86. The pin member 88 is formed of, for example, a metal material so as to have a constant diameter and a predetermined axial length (in the direction of arrows A1 and A2).

The pad member 86 is made of, for example, an elastic material such as rubber, and includes a cylindrical main part 90 and a pad portion 92 formed under the main part 90, while an insertion hole 94 into which the pin member 88 is inserted penetrates through the main part 90 in the axial direction (in the direction of arrows A1 and A2).

The main part 90 is formed to have a substantially uniform outside diameter and has, on the upper end side thereof (on the arrow A1 side), a thick wall portion 96 formed to be thicker toward the radially interior side, while the insertion hole 94 is formed to have a smaller diameter than the pin member 88 in the thick wall portion 96. The pad portion 92 is formed in a skirt shape that spreads radially outward and downward (in the direction of arrow A2) so as to be contactable with the workpiece S1 when the workpiece S1 is held on the workpiece holding surface 16 of the body 12 (see FIG. 3).

Figure 7:
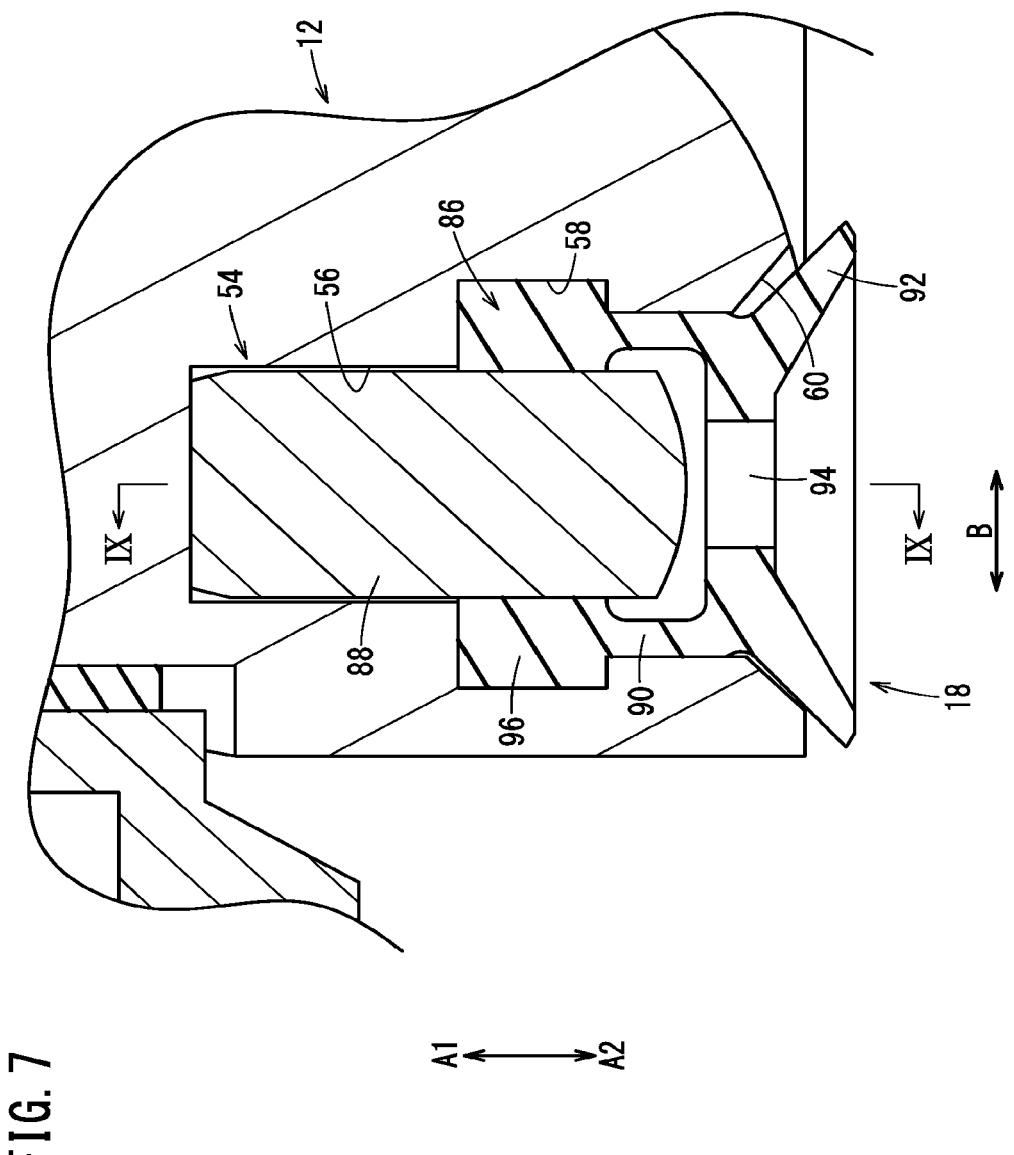
FIG. 7 is an enlarged sectional view of the vicinity of a stopper mechanism in the non-contact transport device of FIG. 3.
Figure 8:
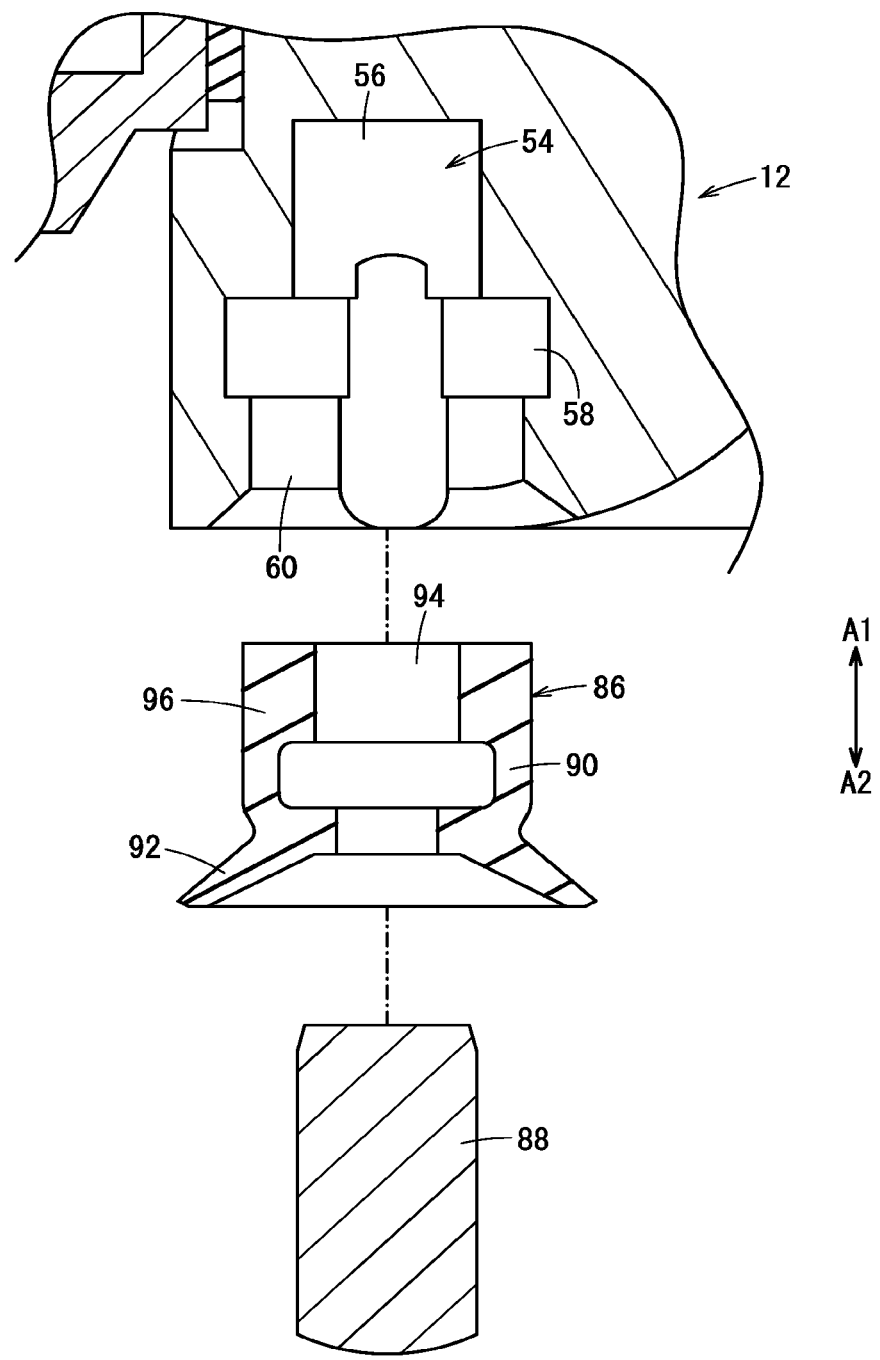
FIG. 8 is an exploded sectional view showing a state where the stopper mechanism shown in FIG. 7 is disassembled.
Figures 10A, 10B:
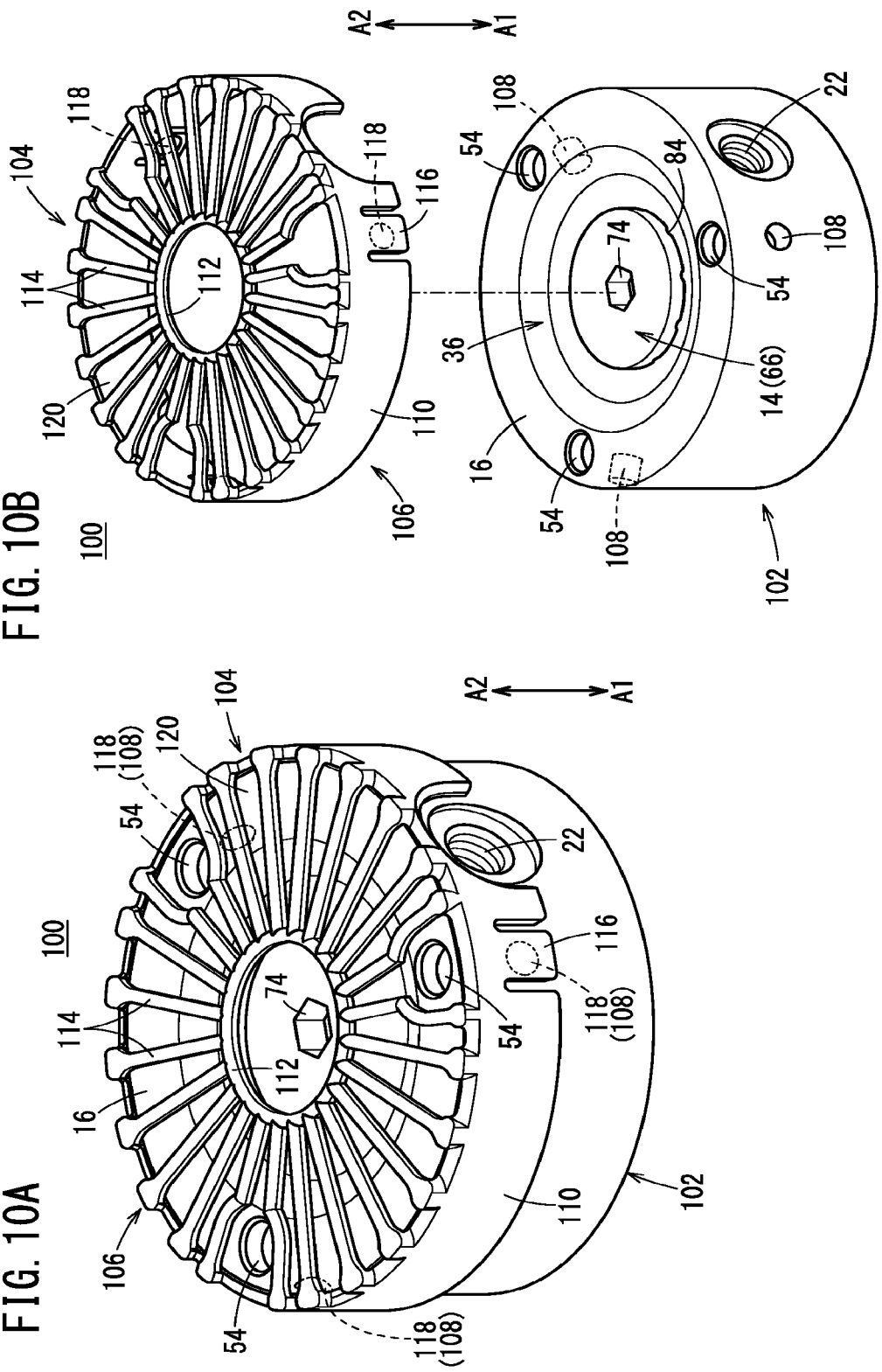
FIG. 10A is an external perspective view of a non-contact transport device according to the second embodiment attached with a first attachment member, as viewed from the workpiece holding surface side.
FIG. 10B is an exploded perspective view of the non-contact transport device of FIG. 10A.
Figure 11:
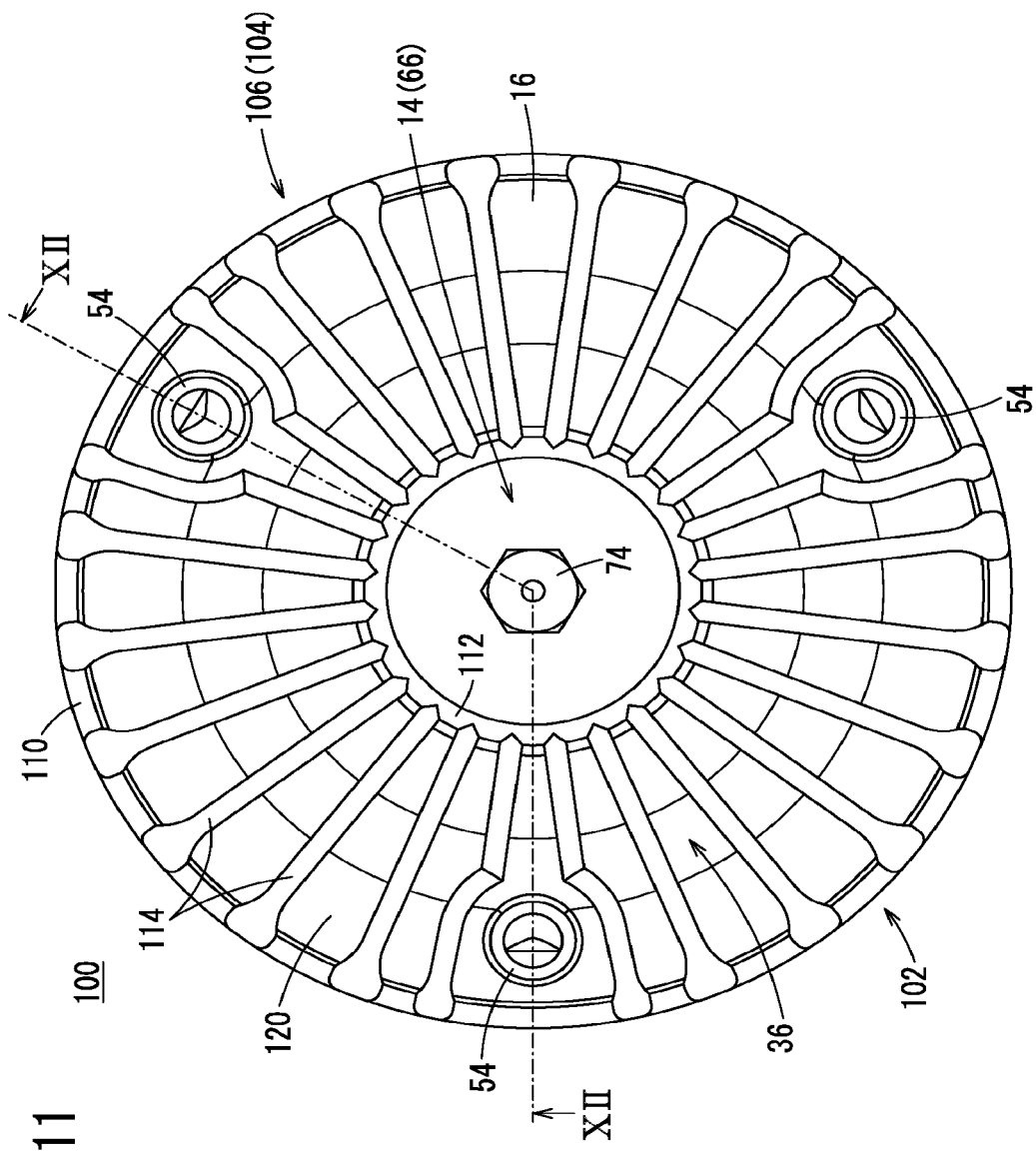
FIG. 11 is a plan view of the non-contact transport device of FIG. 10A as viewed from the first attachment member side.

Thereafter, as shown in FIGS. 7 and 8, the stopper tool 18 is attached as follows. That is, the main part 90 of the pad member 86 is inserted into the mounting hole 54 so that the thick wall portion 96 opposes the large-diametric portion 58 and the main part 90 and a part of the pad portion 92 are fitted inside the pad hole portion 60, then the pin member 88 is inserted into the insertion hole 94 and pushed to the pin hole portion 56. As a result, the thick wall portion 96 is pushed radially outward by the pin member 88 and swells so as to engage with the large-diametric portion 58, whereby the pad member 86 is fixed to the mounting hole 54 with respect to the axial direction while the pad portion 92 projects downward relative to the workpiece holding surface 16.

Further, as shown in FIG. 9, when the pin member 88 is inserted into the insertion hole 94 of the pad member 86, the air remaining inside the pin hole portion 56 is pressurized by the pin member 88 and is preferably discharged to the outside through the air vent hole 62. Accordingly, it is possible to prevent the air remaining inside the pin hole portion 56, from hindering insertion of the pin member 88.

Further, the above-described body 12, deflector 14 and stopper tool 18 that constitute the non-contact transport device 10 may be formed of, for example, a semi-conductor material containing carbon.

The non-contact transport device 10 according to the first embodiment of the present invention is essentially configured as described above, and its operation, action and effect will be described next. Description herein will be made of a case where a disk-shaped plate is held and transported as the workpiece S1 (see FIG. 3).

First, as shown in FIG. 3, the pressure fluid is supplied to the first coupling plug 38 and the first port 22 through a pipe connected to the pressure fluid supply source (not shown). This pressure fluid flows radially inward from the first port 22 to the lead-out hole 34 of the bore 20.

Then, in the lead-out hole 34, the pressure fluid is guided radially outward along the outer peripheral surface of the rod portion 64 of the deflector 14 and the joint portion 82, flows radially outward along the upper surface 66a of the flange portion 66, and is conducted into the hollow 36 in radial directions through the plurality of nozzle grooves 84 (lead-out channels 85). In this case, since the plurality of nozzle grooves 84 are formed in the same shape and are arranged equidistantly in the circumferential direction, the pressure fluid is led out through the nozzle grooves 84, evenly with respect to the circumferential direction of the hollow 36.

The pressure fluid conducted into the hollow 36 through the nozzle grooves 84 flows radially outward along the first and second curved surfaces 48 and 50 toward the workpiece holding surface 16, owing to the Coanda effect.

When the non-contact transport device 10 including this body 12 is moved by, for example, a robot arm or the like so as to bring the body 12 close to and substantially parallel to the workpiece S1, a negative pressure is generated by the pressure fluid flowing at high speed between the workpiece S1 and the workpiece holding surface 16 as the workpiece holding surface 16 approaches the workpiece S1.

Then, this negative pressure produces a suction force acting toward the workpiece holding surface 16 side (in the direction of arrow A1) so that the workpiece S1 is suctioned toward the workpiece holding surface 16 side (in the direction of arrow A1) and comes into contact with the pad portion 92 of the pad member 86 in each stopper tool 18. As a result, the workpiece S1 is kept in a non-contact state of being spaced a predetermined distance from the body 12 in the axial direction, and held substantially parallel to the workpiece holding surface 16 (see the two-dot chain line in FIG. 3).

Then, after moving the non-contact transport device 10 in which the workpiece S1 is held without contacting the workpiece holding surface 16, to a desired position by means of the robot arm or the like, supply of the pressure fluid to the first port 22 is stopped, whereby the workpiece S1 is released from the suctioned state so as to be placed in a desired position.

Additionally, when the workpiece S1 is suctioned while opposing the workpiece holding surface 16, the detection port 74 connected to the center of the hollow 36, the detection passage 76 and the communication hole 72 have the same pressure, so that the pressure in the hollow 36 is detected by a pressure detecting unit (not shown) through the second port 24. Thus, based on the pressure value detected by the pressure detecting unit, it is possible to check whether a suction force (pressure, lift) sufficient to suction the workpiece S1 is generated on the workpiece holding surface 16 of the body 12.

As described above, in the first embodiment, the deflector 14 is housed in the bore 20 of the body 12 constituting the non-contact transport device 10 while the body 12 has the hollow 36 depressed with respect to the workpiece holding surface 16 formed in the lower end thereof in the axial direction. Further, the deflector 14 has the plurality of nozzle grooves 84 formed on the outer peripheral part of the flange portion 66 whose diameter is expanded radially outward. The nozzle grooves 84 are each formed so as to have an arc-shaped cross section that is hollowed toward the workpiece holding surface 16 side (in the direction of arrow A2), extend radially and are arranged equidistantly along the circumferential direction, to form the lead-out channels 85 that oppose the flat surface 52 of the hollow 36.

Thus, by arranging the plurality of nozzle grooves 84 having an arc-shaped cross section along the circumferential direction, so as to conduct the pressure fluid introduced from the first port 22 to the hollow 36 through the nozzle grooves 84 (through lead-out channels 85) and cause the pressure fluid to flow to the workpiece holding surface 16 along the first and second curved surfaces 48 and 50 by virtue of the Coanda effect, it is possible to suppress generation of eddy currents when the pressure fluid flows along the nozzle grooves 84 and suitably reduce the pressure loss, as compared to the case where the nozzle grooves 84 are formed to have, for example, a circular cross section or rectangular cross section.

As a result, by causing the pressure fluid to flow from the nozzle grooves 84 to the hollow 36 in a stable manner, the pressure fluid can flow from the hollow 36 to the workpiece holding surface 16 at a desired flow rate. Accordingly, a larger suction force can be obtained in the position opposing the workpiece holding surface 16. Therefore, the workpiece S1 can be more reliably and stably held and transported in a non-contact manner with the workpiece S1 being out of contact with the workpiece holding surface 16 of the non-contact transport device 10.

Further, by arranging the outer peripheral part of the flange portion 66 where the nozzle grooves 84 are provided in the deflector 14, so as to abut the flat surface 52 of the hollow 36 in the body 12, and by providing the plurality of nozzle grooves 84 (lead-out channels 85) so as to oppose the flat surface 52, it is possible to dispose the nozzle grooves 84 at positions close to the first curved surface 48. Therefore, the pressure fluid can flow from the nozzle grooves 84 to the workpiece holding surface 16 along the first curved surface 48, by virtue of the Coanda effect.

Furthermore, by forming the nozzle grooves 84 having an arc-shaped cross section in the deflector 14 and bringing them into contact with the flat surface 52 of the body 12, it is possible to easily and highly accurately configure the lead-out channels 85 for leading the pressure fluid.

Furthermore, provision of the plurality of stopper tools 18 capable of holding the workpiece S1 suctioned to the workpiece holding surface 16 of the body 12 enables stable holding and transport of the workpiece S1 suctioned to the workpiece holding surface 16. Insertion of the pin member 88 after inserting the pad member 86 of the stopper tool 18 into the mounting hole 54 of the body 12 enables the thick wall portion 96 to swell radially outward and engage with the large-diametric portion 58, thus facilitating reliable fixing.

Further, use of an elastic material for forming the pad member 86 that constitutes the stopper tool 18 and formation of the pad portion 92 into a skirt shape spreading downward enable the stopper tool 18 to suitably follow the workpiece S1 when the workpiece S1 comes into contact with the pad portion 92, and enable the stopper tool 18 to adapt to change in the axial gap (in the direction of arrows A1 and A2) between the workpiece holding surface 16 and the workpiece S1 depending on the suction force when the workpiece S1 is suctioned.

Since the sub port 26 is provided on the upper end of the body 12, it is possible to freely select the joint position of the pipe for supplying the pressure fluid according to the use environment of the non-contact transport device 10.

Since the second port 24 of the body 12 communicates with the hollow 36 opened to the workpiece holding surface 16, connecting a pressure detecting unit capable of detecting the pressure to the second port 24 makes it possible to detect the pressure generated on the workpiece holding surface 16. Therefore, it is possible to easily and reliably check whether or not a suction force necessary and sufficient to suction the workpiece S1 is generated by detecting the suction force on the workpiece holding surface 16 by the pressure detecting unit.

Further, the present invention is not limited to the case where the pressure detecting unit is connected to the second port 24. For example, a negative pressure fluid may be supplied to the second port 24 when the workpiece S1 is suctioned to the workpiece holding surface 16, so as to supply the negative pressure fluid to the center of the hollow 36 through the communication hole 72, the detection passage 76 and the detection port 74. As a result, in addition to the Coanda effect of the pressure fluid supplied from the first port 22 to the hollow 36, the negative pressure fluid supplied into the hollow 36 makes it possible to enhance the suction force for the workpiece S1.

Further, in releasing the suctioned state of the workpiece S1, by supplying a positive pressure fluid into the hollow 36 through the second port 24 at the same time as supply of the pressure fluid from the first port 22 to the hollow 36 is stopped, it is possible to quickly release the workpiece S1 from the suctioned state and place the workpiece S1 at a desired position.

Furthermore, forming the body 12, the deflector 14 and the stopper tool 18 constituting the non-contact transport device 10 from a semi-conductor material containing carbon makes it possible to suitably prevent generation of static electricity when, for example, a semiconductor, substrate or the like is transported as the workpiece S1. Thereby, it is possible to avoid damage to the workpiece S1 due to static electricity. Further, when clothing is transported as the workpiece S1, it is possible to favorably prevent the workpiece S1 from clinging to the body 12 even if the workpiece S1 is charged with static electricity.

Further, making the radial length L of the lead-out channel 85 larger than the axial depth H of the nozzle groove 84 enables the pressure fluid to be led through the lead-out channels 85 to the hollow 36 stably, and to smoothly flow along the first and second curved surfaces 48 and 50, whereby it is possible to obtain a more stable suction force.

Next, a non-contact transport device 100 according to the second embodiment is shown in FIGS. 10A to 12. The same components as those of the above non-contact transport device 10 according to the first embodiment are assigned with the same reference numerals, and detailed description thereof will be omitted.

The non-contact transport device 100 according to the second embodiment differs from the non-contact transport device 10 according to the first embodiment in that a first attachment member 106 having a holder 104 is detachably provided at the lower end of a body 102 on the workpiece holding surface 16 side (on the arrow A2 side).

Engagement holes 108 into which bumps 118 on the first attachment member 106, which will be described later, are fitted are formed on the outer peripheral surface of the body 102 of the non-contact transport device 100, as shown in FIGS. 10A to 12. The engagement hole 108 is, for example, a recess having a semicircular cross section and hollowed radially inward with respect to the outer peripheral surface of the body 102. The same number (e.g., three) of the engagement holes 108 as the number of the bumps 118 are formed equidistantly along the circumferential direction of the body 102. Further, the engagement holes 108 are arranged at a position above the workpiece holding surface 16 of the body 102 (in the direction of arrow A1) by a predetermined height.

On the other hand, the first attachment member 106 to be attached to the body 102 is formed of, for example, a resin material, and includes a cover wall 110 having a circular cross section, a ring 112 disposed in the center of the cover wall 110, and a plurality of bridges 114 connecting the lower end of the cover wall 110 and the ring 112. The ring 112 and the bridges 114 function as the holder 104 capable of holding a workpiece S2 (see FIG. 12).

The cover wall 110 is formed in a cylindrical shape having a predetermined height in the axial direction (in the direction of arrows A1 and A2), and is formed to have an inside diameter substantially the same as or slightly greater than the outside diameter of the body 102. That is, the cover wall 110 is formed in such a size as to be able to cover the outer peripheral side of the body 102.

Figure 12:
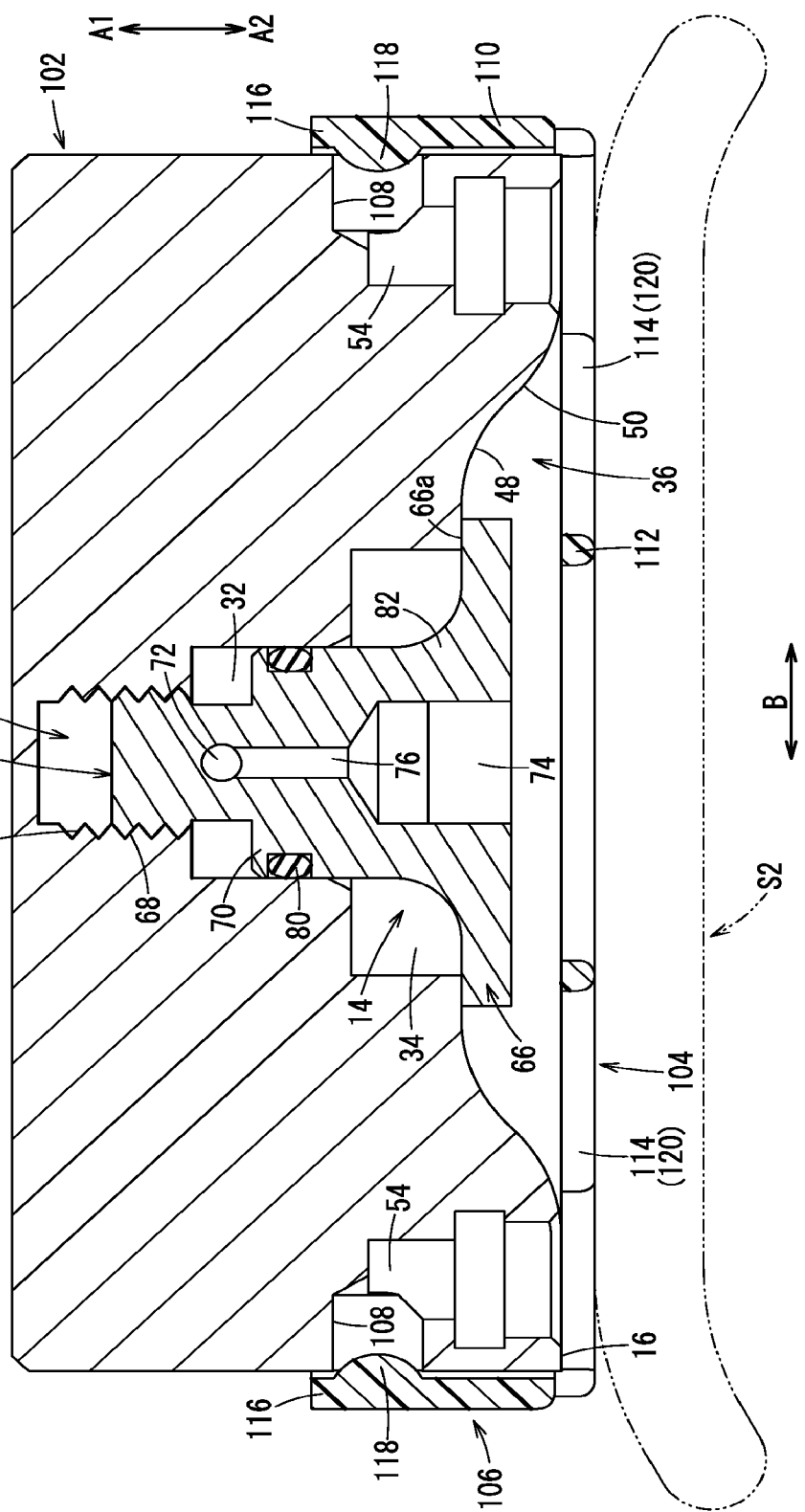
FIG. 12 is a sectional view taken along a line XII-XII of FIG. 11.

Further, the cover wall 110 has, in the upper part thereof, a plurality of engaging pieces 116 capable of being tilted in the radial direction. The engaging pieces 116 each have the bump 118 formed on the inner side thereof so as to project radially inward. The bumps 118 are each formed in a hemispherical shape, for example, and are provided along the circumferential direction in the same number and at the same intervals as the engagement holes 108 of the body 102 so as to be engaged with the engagement holes 108. Further, as shown in FIG. 12, the engagement hole 108 is formed so as to communicate with the mounting hole 54 to which the stopper tool 18 can be mounted. Therefore, the mounting hole 54 can communicate with the outside through the engagement hole 108 without providing, for example, the air vent hole 62 as shown in FIG. 9.

The ring 112 is formed, for example, with a diameter slightly smaller than the flange portion 66 of the deflector 14, and is arranged coaxially with the body 102 and the deflector 14 when the first attachment member 106 is attached to the body 102.

The plurality of bridges 114 are provided apart from each other along the circumferential direction of the first attachment member 106 with their radial inner ends connected to the outer periphery of the ring 112 and their radial outer ends connected to the axial lower end of the cover wall 110. The bridges 114 extend substantially orthogonally to the extending direction (the direction of arrows A1 and A2) of the cover wall 110, and the bridges 114 are formed to be substantially flush with the ring 112.

That is, the axial end of the first attachment member 106 is formed from the ring 112 and the plurality of bridges 114 connected to the ring 112, and the ring 112 and the bridges 114 define a plurality of apertures 120 therebetween. The outside and the inside of the first attachment member 106 communicate with each other in the axial direction (the direction of arrows A1 and A2) through the apertures 120.

The holder 104 is not limited to the configuration formed from the ring 112 and the plurality of bridges 114 extending radially outward from the ring 112 as described above, for example, and as long as it covers the range facing the first curved surface 48, the plurality of bridges may be formed so as to intersect each other in a mesh pattern, or the plurality of bridges may be formed substantially parallel to each other in a slit pattern.

As shown in FIG. 12, the first attachment member 106 thus configured is mounted to the lower end of the body 102 having the workpiece holding surface 16 such that the cover wall 110 covers the outer peripheral surface of the body 102 while the vicinity of the radial outer ends of the bridges 114 abuts the workpiece holding surface 16, whereby the first attachment member 106 is positioned in the axial direction relative to the body 102.

In this state, the plurality of bumps 118 are fitted in the engagement holes 108 so that the first attachment member 106 covers the lower end of the body 102 and is fixed. Additionally, the vicinity of the radial inner ends of the plurality of bridges 114 and the ring 112 oppose the hollow 36 of the body 102 and are held a predetermined distance apart in the axial direction from the flange portion 66 of the deflector 14.

On the other hand, when the first attachment member 106 attached to the body 102 is removed, the plurality of engaging pieces 116 of the cover wall 110 are spread outward in the radial direction so as to separate from the outer peripheral surface of the body 102, whereby fitting of the bumps 118 into the engagement holes 108 is released. Then, the first attachment member 106 can be removed by being moved in the direction away from the workpiece holding surface 16 of the body 102 (the direction of arrow A2).

Thus, in the second embodiment, the first attachment member 106 capable of being detachably attached to the lower end of the body 102 constituting the non-contact transport device 100, is provided. As a result, when, for example, a flexible or soft workpiece S2 such as a thin soft cloth, sheet or the like is suctioned, a suction force (lift) generated by the pressure fluid flowing from the hollow 36 to the workpiece holding surface 16 is exerted on the outside through the apertures 120 of the first attachment member 106 so that the workpiece S2 is suctioned and held by the suction force on the holder 104 formed of the ring 112 and bridges 114.

As a result, the flexible or soft workpiece S2 is held by the holder 104 and prevented from being drawn into the hollow 36, so as to reliably maintain the strength of suction force while suppressing deformation of the workpiece S2 owing to its contact with the holder 104.

As a result, even when the workpiece S2 is a thin soft cloth or sheet, attachment of the first attachment member 106 to the workpiece holding surface 16 side of the body 102 enables the workpiece S2 to be reliably suctioned and transported by the holder 104 without being deformed and also to be suctioned by the holder 104 in a stable manner, thus making it possible to reduce the fluttering noise arising when the suctioned state of the workpiece S2 is unstable.

Further, since the first attachment member 106 has a structure that can be easily attached to and detached from the body 102, it is possible to suction various types of workpieces S1 and S2 with the single non-contact transport device 10 by attaching or detaching the first attachment member 106 according to the type of the workpieces S1 and S2.

Figure 13:
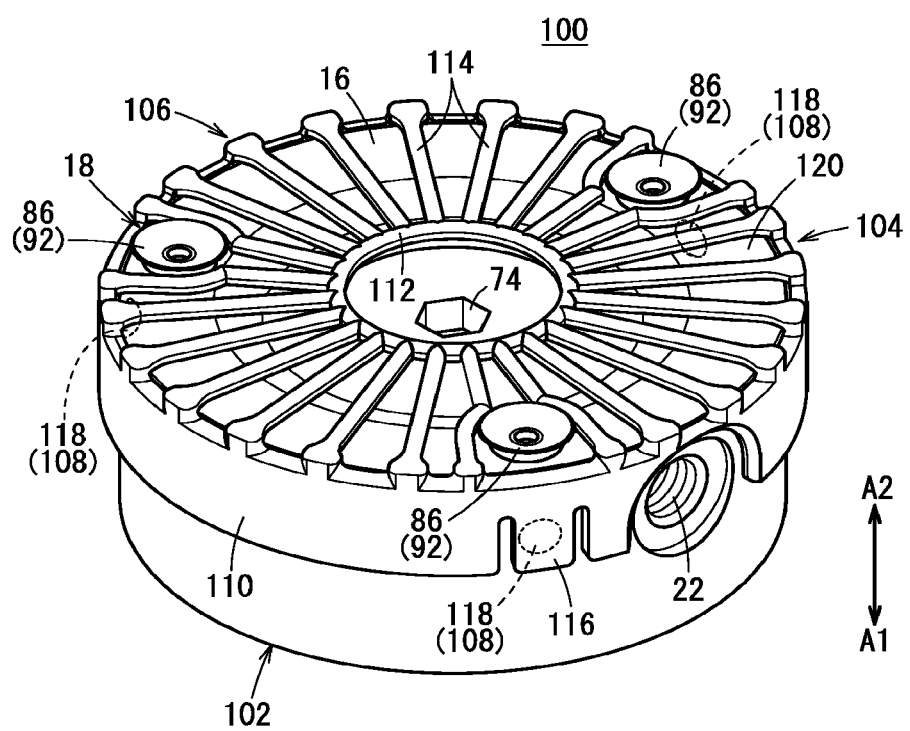
FIG. 13 is an external perspective view showing a state where stopper tools are attached to the non-contact transport device of FIG. 10A.

Further, as shown in FIG. 13, by mounting the stopper tools 18 on the workpiece holding surface 16 of the body 102, it is possible for the pad members 86 to more reliably hold and transport the workpiece S2 suctioned on the holder 104.

Figure 14:
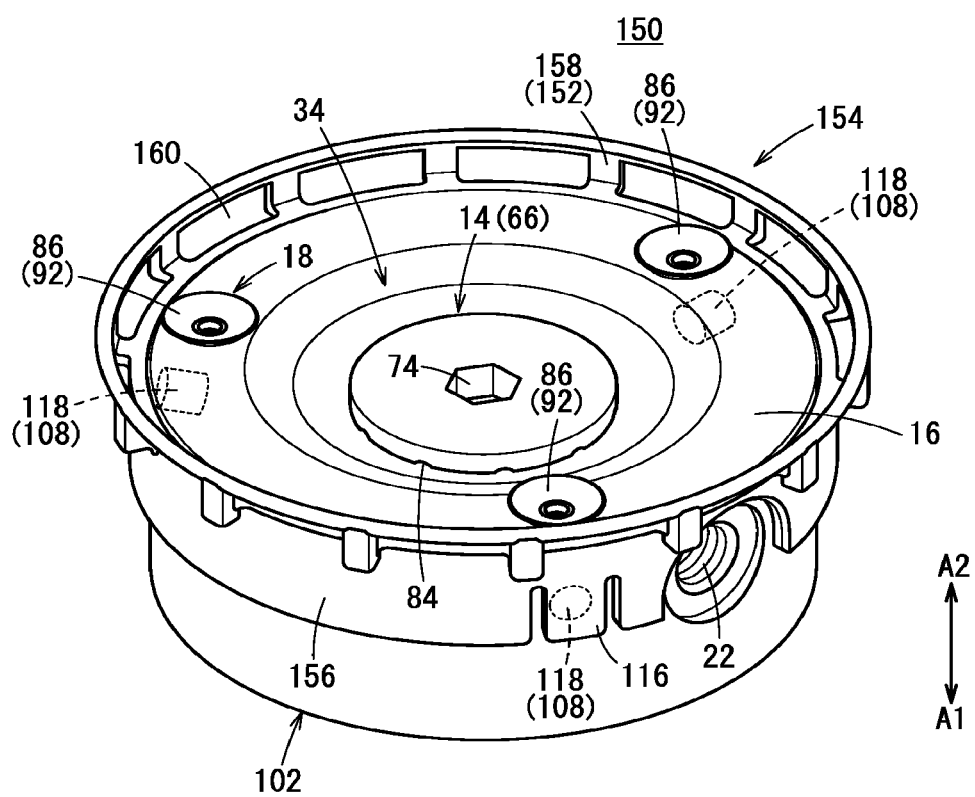
FIG. 14 is an external perspective view of a non-contact transport device according to the third embodiment attached with a second attachment member, as viewed from the workpiece holding surface side.
Figure 15:
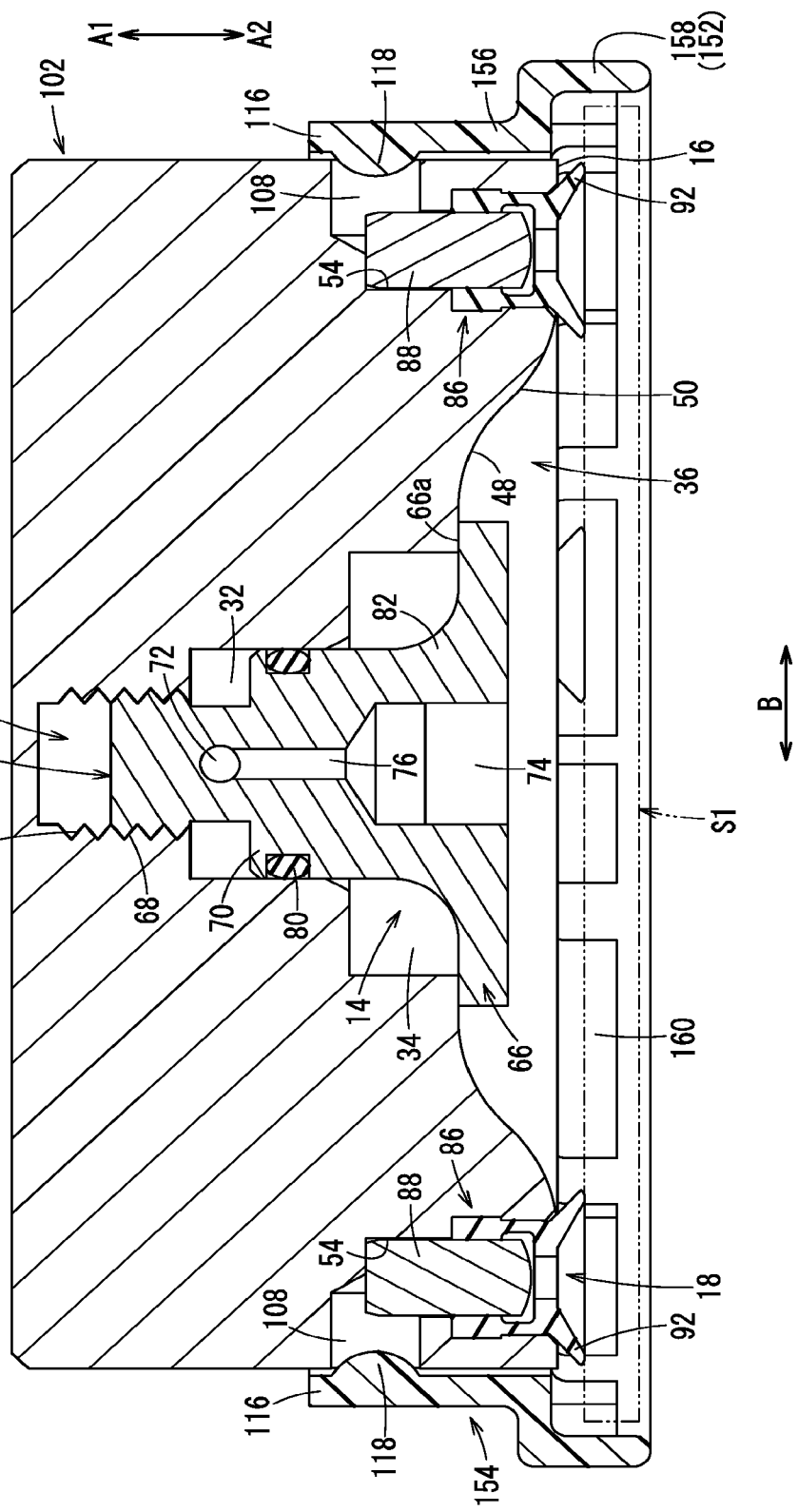
FIG. 15 is an overall sectional view of the non-contact transport device of FIG. 14.

Next, a non-contact transport device 150 according to the third embodiment is shown in FIGS. 14 and 15. The same components as those of the non-contact transport device 100 according to the second embodiment described above are assigned with the same reference numerals, and detailed description thereof will be omitted.

The non-contact transport device 150 according to the third embodiment differs from the non-contact transport device 100 according to the second embodiment in that a second attachment member 154 having an annular holder 152 is detachably provided at the lower end of the body 102 on the workpiece holding surface 16 side (on the arrow A2 side).

The second attachment member 154 is formed of, for example, a resin material, and includes a cover wall 156 having a circular cross section, and an annular guide wall 158 that is expanded in diameter outward from the lower edge of the cover wall 156 and extends in the axial direction (direction of arrow A2). This guide wall 158 functions as the holder 152 capable of holding the workpiece S1.

The guide wall 158 is formed at a predetermined height in the direction (the direction of arrow A2) away from the workpiece holding surface 16, has a diameter at least equal to or greater than the diameter of the cover wall 156, and includes a plurality of openings 160 that are radially opened and arranged along the circumferential direction.

As shown in FIG. 15, the second attachment member 154 is mounted to the lower end of the body 102 having the workpiece holding surface 16 so that the cover wall 156 covers the outer peripheral surface of the body 102 and is positioned and fixed in the state where the guide wall 158 projects in the axial direction (direction of arrow A2) relative to the workpiece holding surface 16 of the body 102.

Thus, in the third embodiment, the second attachment member 154 capable of being detachably attached to the lower end of the body 102 constituting the non-contact transport device 150 is provided. Therefore, even when, for example, a disc-shaped workpiece S1 being suctioned is affected by acceleration/deceleration during transportation, the workpiece S1 can be always held at a position opposing the workpiece holding surface 16 by the guide wall 158 provided on the outer peripheral side, so that the workpiece S1 will not be thrown radially outward from the workpiece holding surface 16. As a result, even in the above case, the workpiece S1 can be reliably transported.

Further, even when no stopper tool 18 is provided, the guide wall 158 can hold the workpiece S1 on the outer peripheral side thereof, whereby it is possible to transport the workpiece S1 reliably to a desired position while keeping the workpiece S1 out of contact with the workpiece holding surface 16.

It should be noted that the non-contact transport device according to the present invention is not limited to the above-described embodiments, and it goes without saying that various configurations can be adopted without departing from the gist of the present invention.

What is claimed is:

1. A non-contact transport device that suctions a workpiece by supplying a pressure fluid and holds and transports the workpiece in a non-contact state, the non-contact transport device comprising:
    a body including, in an axial end thereof, a workpiece holding surface opposing the workpiece;
    a passage formed inside the body and configured to allow the pressure fluid supplied from an air supply unit to flow therethrough;
    a plurality of nozzles formed inside the body along a circumferential direction of the body, extending outward in a radial direction in communication with a downstream end of the passage, and configured to conduct the pressure fluid inside the passage toward the workpiece holding surface;
    a hollow axially depressed with respect to the workpiece holding surface and configured to connect radial ends of the nozzles and the workpiece holding surface; and
    a deflector provided separately from the body, the deflector including a flange portion housed in the hollow, the deflector being fixed inside the body,
    wherein the nozzles are provided between the flange portion and the hollow, and
    wherein the nozzles extend outward in the radial direction
    wherein the hollow includes a flat surface opposing the flange portion of the deflector,
    wherein an upper surface of the flange portion abuts the flat surface,
    wherein a plurality of grooves are formed on the upper surface of the flange portion such that the plurality of grooves are spaced from each other along a circumferential direction of the flange portion, and
    wherein the plurality of nozzles are formed by the plurality of grooves,
    wherein each of the nozzles includes a width which is largest in a width direction at an opening edge opposing the flat surface, the width direction being perpendicular to a nozzle extending direction, and
    each of the nozzles has an at least partially arc-shaped cross section which satisfies a relationship of $\frac{1}{30}W < H \leq W$, where W is the width of the opening edge in the width direction and H is an axial depth of the nozzles in an axial direction extending along an axial direction of the deflector.

2. The non-contact transport device according to claim 1, wherein the nozzles are formed in an area abutting an inner wall surface of the hollow so as to constitute, between each of the nozzles and the inner wall surface, a flow channel configured to allow the pressure fluid to flow therethrough.

3. The non-contact transport device according to claim 2, wherein the flow channel is configured such that a length thereof in the radial direction is greater than a depth thereof in an axial direction of the deflector.

4. The non-contact transport device according to claim 1, further comprising a stopper tool provided on the workpiece holding surface and configured to come into contact with the workpiece when the workpiece is suctioned,
    wherein the stopper tool includes a pad member formed of an elastic material and partially protruding relative to the workpiece holding surface, and a pin member inserted into the pad member so as to fix the pad member to the body.

5. The non-contact transport device according to claim 4, wherein the body, the deflector and the pad member are formed of semi-conductive material.

6. The non-contact transport device according to claim 1, wherein an attachment member is detachably attached to the body, the attachment member including a holder that opposes the workpiece holding surface, is arranged a predetermined distance apart from the workpiece holding surface, and includes a plurality of apertures.

7. The non-contact transport device according to claim 1, wherein an attachment member is detachably attached to the body, the attachment member including an annular holder that is located on the side of the workpiece holding surface and extends in the axial direction on a radially outer side of the workpiece holding surface.

8. The non-contact transport device according to claim 1, wherein the body includes a port opened on an end thereof on an opposite side to the workpiece holding surface or opened on a side surface thereof substantially orthogonal to the axial direction, and the port communicates with the hollow through an inside of the deflector.

9. A non-contact transport device that suctions a workpiece by supplying a pressure fluid and holds and transports the workpiece in a non-contact state, the non-contact transport device comprising:
    a body including, in an axial end thereof, a workpiece holding surface opposing the workpiece;
    a passage formed inside the body and configured to allow the pressure fluid supplied from an air supply unit to flow therethrough;
    a plurality of nozzles formed inside the body along a circumferential direction of the body, extending outward in a radial direction in communication with a downstream end of the passage, and configured to conduct the pressure fluid inside the passage toward the workpiece holding surface; and
    a hollow axially depressed with respect to the workpiece holding surface and configured to connect radial ends of the nozzles and the workpiece holding surface, a stopper tool provided on the workpiece holding surface and configured to come into contact with the workpiece when the workpiece is suctioned, wherein the nozzles extend outward in the radial direction with at least a part of each of the nozzles hollowed toward a side of the workpiece holding surface in an axial direction of the body so as to have an arc-shaped cross section, wherein the stopper tool includes a pad member formed of an elastic material and partially protruding relative to the workpiece holding surface, and a pin member inserted into the pad member so as to fix the pad member to the body, and wherein the pad member includes a pad portion that spreads like a skirt in a direction away from the workpiece holding surface so as to he contactable with the workpiece.

10. A non-contact transport device that suctions a workpiece by supplying a pressure fluid and holds and transports the workpiece in a non-contact state, the non-contact transport device comprising:

a body including, in an axial end thereof, a workpiece holding surface opposing the workpiece:

a passage formed inside the body and configured to allow the pressure fluid supplied from an air supply unit to flow therethrough;

a plurality of nozzles formed inside the body along a circumferential direction of the body, extending outward in a radial direction in communication with a downstream end of the passage, and configured to conduct the pressure fluid inside the passage toward the workpiece holding surface;

a hollow axially depressed with respect to the workpiece holding surface and configured to connect radial ends of the nozzles and the workpiece holding surface; and a deflector provided separately from the body, the deflector including a flange portion housed in the hollow, the deflector being fixed inside the body, wherein the nozzles are provided between the flange portion and the hollow, wherein the nozzles extend outward in the radial direction with at least a part of each of the nozzles hollowed toward a side of the workpiece holding surface in an axial direction of the body so as to have an arc-shaped cross section, wherein the deflector includes:

a detection port provided in the flange portion and communicating with the hollow, and a detection passage connected to the detection port, and wherein a connection port of the body that is connected to a pressure detecting device communicates with the detection port through the detection passage.

11. The non-contact transport device according to claim 10, wherein the body includes an intermediate hole formed at an upper portion of the passage, and wherein the detection port and the connection port communicate with each other through the intermediate hole.

* * * * *